(12) United States Patent
Ward

(10) Patent No.: US 9,082,811 B2
(45) Date of Patent: Jul. 14, 2015

(54) 3C-SIC TRANSISTOR

(71) Applicant: Anvil Semiconductors Limited, Warwickshire (GB)

(72) Inventor: Peter Ward, Cambridgeshire (GB)

(73) Assignee: Anvil Semiconductors Limited, Warwickshire (GB)

( * ) Notice: Subject to any disclaimer, the term of this patent is extended or adjusted under 35 U.S.C. 154(b) by 42 days.

(21) Appl. No.: 14/034,024

(22) Filed: Sep. 23, 2013

(65) Prior Publication Data
US 2014/0014973 A1    Jan. 16, 2014

Related U.S. Application Data

(63) Continuation-in-part of application No. PCT/GB2012/052627, filed on Oct. 23, 2012.

(30) Foreign Application Priority Data

Oct. 26, 2011 (GB) .................................. 1118502.2

(51) Int. Cl.
*H01L 29/15* (2006.01)
*H01L 29/739* (2006.01)
(Continued)

(52) U.S. Cl.
CPC ........ *H01L 29/7393* (2013.01); *H01L 21/0262* (2013.01); *H01L 21/02381* (2013.01); *H01L 21/02447* (2013.01); *H01L 21/02529* (2013.01);
(Continued)

(58) Field of Classification Search
CPC ............... H01L 29/1608; H01L 29/42368; H01L 29/7828; H01L 29/0623; H01L 29/1041; H01L 29/045; H01L 29/7395

USPC ........................................ 257/76, 77; 438/478
See application file for complete search history.

(56) References Cited

U.S. PATENT DOCUMENTS

| 6,342,404 B1 | 1/2002 | Shibata et al. |
| 2008/0105949 A1* | 5/2008 | Zhang et al. .................. 257/584 |
| 2010/0065857 A1* | 3/2010 | Harada et al. .................. 257/77 |

FOREIGN PATENT DOCUMENTS

WO    WO 2006/060339 A2    6/2006

OTHER PUBLICATIONS

International Search Report for corresponding International Application No. PCT/GB2012/052627 mailed Apr. 23, 2013.
(Continued)

*Primary Examiner* — Brook Kebede
(74) *Attorney, Agent, or Firm* — Renner, Otto, Boisselle & Sklar, LLP

(57) ABSTRACT

A bipolar power semiconductor transistor is disclosed. The transistor includes a semiconductor substrate of a first conductivity type, a first semiconductor region of the first conductivity type disposed on the semiconductor substrate; a semiconductor drift region of a second conductivity type, opposite the first conductivity type, disposed on the first semiconductor region, a body region of the first conductivity type located within the semiconductor drift region, a source region of the second conductivity type located within the body region, a gate placed above and in contact to the source region, the gate to control charge in a channel region between the semiconductor drift region and the source region and to thereby control flow of charge within the semiconductor drift region. The semiconductor substrate includes a material having silicon (Si) and the first semiconductor region includes a material having 3-step cubic silicon carbide (3C-SiC).

22 Claims, 5 Drawing Sheets

(51) Int. Cl.
  *H01L 21/02*  (2006.01)
  *H01L 29/66*  (2006.01)
  *H01L 29/04*  (2006.01)
  *H01L 29/16*  (2006.01)
  *H01L 29/74*  (2006.01)

(52) U.S. Cl.
  CPC .... *H01L 21/02642* (2013.01); *H01L 21/02645* (2013.01); *H01L 29/045* (2013.01); *H01L 29/1608* (2013.01); *H01L 29/66068* (2013.01); *H01L 29/66363* (2013.01); *H01L 29/7395* (2013.01); *H01L 29/74* (2013.01)

(56) References Cited

OTHER PUBLICATIONS

Kaminski et al., "SiC and GaN Devices—Wide Band-Gap is not all the Same", iPOWER2, Warwick/Coventry, Nov. 28, 2012 (cited on p. 2, line 11 of the specification).

Dimitrijev et al., "Advances in SiC power MOSFET technology", Microelectronics Reliability 43 (2003) 225-233 (cited on p. 3, line 25 of the specification).

Edgar et al., "Selective epitaxial growth of silicon carbide on Si02 masked Si(100): The effects of temperature", Journal of Applied Physics, American Institute of Physics, New York, US, vol. 84, No. 1, Jul. 1, 1998, pp. 201-204, XP012045156.

Wu et al., "A comparison of Si02 and Si3N4 masks for selective epitaxial growth of 3C-SiC films on Si", Materials Science Forum, Trans Tech Publications Ltd.—Switzerland, vol. 353-356, Jan. 1, 2001, pp. 171-174, XP009166208.

Nishino et al., "Lateral over-growth of 3C-SiC on patterned Si(111) substrates", Journal of Crystal Growth, Elsevier, Amsterdam, NL, vol. 237-239, Apr. 1, 2002, pp. 1250-1253, XP004355976.

Teker, K. "Selective epitaxial growth of 3C-SiC on patterned Si using hexamethyldisilane by APCVD", Journal of Crystal Growth, Elsevier, Amsterdam, NL, vol. 257, No. 3-4, Oct. 1, 2003, pp. 245-254, XP004452937.

Gupta et al., "Selective epitaxy and lateral overgrowth of 3C-SiC on Si—A review", Progress in Crystal Growth and Characterization of Materials, Elsevier Publishing, Barking, GB, vol. 51, No. 1-3, Jan. 1, 2005, pp. 43-69, XP027827904.

Gwo et al., "Selective-area chemical-vapor deposition of Si using a bilayer dielectric mask patterned by proximal probe oxidation", Journal of Vacuum Science and Technology: Part A, AVS/AIP, Melville, NY, US, vol. 19, No. 4, Jul. 1, 2001, pp. 1806-1811, XP012005718.

Wu et al., "A comparison of Si02 and Si3N4 masks for selective epitaxial growth of 3C-SiC films on Si", Materials Science Forum, Trans Tech Publications Ltd.—Switzerland, vol. 353-356, Jan. 1, 2001, pp. 171-174, XP009166208 (previously listed on IDS submitted with application on Sep. 23, 2013).

Nishino et al., "Lateral over-growth of 3C-SiC on patterned Si(111) substrates", Journal of Crystal Growth, Elsevier, Amsterdam, NL, vol. 237-239, Apr. 1, 2002, pp. 1250-1253, XP004355976 (previously listed on IDS submitted with application on Sep. 23, 2013).

Teker, K. "Selective epitaxial growth of 3C-SiC on patterned Si using hexamethyldisilane by APCVD", Journal of Crystal Growth, Elsevier, Amsterdam, NL, vol. 257, No. 3-4, Oct. 1, 2003, pp. 245-254, XP004452937 (previously listed on IDS submitted with application on Sep. 23, 2013).

\* cited by examiner

3C-SIC TRANSISTOR

RELATIONSHIP TO EARLIER APPLICATIONS

This application is a continuation-in-part of PCT application number PCT/GB2012/052627 and published as WO2013/061047, which is hereby incorporated by reference in its entirety.

FIELD OF THE INVENTION

This invention relates to a power semiconductor transistor, particularly but not exclusively, to a bipolar power semiconductor transistor.

BACKGROUND TO THE INVENTION

It is known that semiconductor devices are employed as switches and they operate in "on" and "off" states. In the on-state the device can conduct high currents at modest voltages and the conduction losses are desired to be reduced. In the offstate the device can withstand the system maximum voltage with little or no current passing. There are generally two types of devices in the market, unipolar (MOSFET) where conduction is by majority carriers only, and bipolar where conduction is by majority and minority carriers. One fundamental problem is that to withstand a certain voltage a certain thickness of material is required (a drift region), set by a critical field for breakdown. Hence the higher the voltage the thicker and more resistive the drift region becomes. This sets the fundamental limit of a unipolar device in a given material because there is a compromise between voltage capability and device conductivity.

For these reasons wide band gap semiconductors with their much higher critical fields can be preferred to the standard silicon (Si). Of course, since Si is such an established engineering material, ways have been found to overcome this fundamental limit to some degree in the development of Superjunction MOSFETs. However the price paid as ever is much increased device complexity and higher manufacturing costs. The other way of overcoming this limit is to move from unipolar to bipolar devices. In this case the drift region resistivity is reduced in the on-state by the injection of minority carriers. The best known of these devices in the Si world is the Insulated Gate Bipolar Transistor (IGBT). In reality however this device is generally similar to a standard (non-SJ) MOSFET with the n+ Drain contact replaced by a p+ region which acts as an injector in the on-state. Of course there is a price to be paid for this enhanced performance in that the switching speed of an IGBT is much lower than that of a MOSFET because of the lengthy time required to remove the minority carriers from the drift region when switching the device off. This also increases switching losses.

Turning back to the trade-off between the breakdown voltage and specific on-resistance in unipolar device, consideration of basic materials properties and the structures of unipolar (MOSFET) devices are discussed below. FIG. 1 illustrates a recently published (N. Kaminski & O. Hilt, iPower2, Nov. 28, 2012, 18) graph illustrating trade-off between the specific on-resistance versus breakdown voltage for various Si and 4H-SiC devices.

Considering first the Si data, the mature Si-MOSFET technology shows clearly the difference between practical products and the theoretical limit. For example at 1000V the theory suggests 200 m$\Omega$-cm$^2$ while in practise 600 m$\Omega$-cm$^2$ is achieved. This data also shows the dramatic advantage of Super Junction technology with ~75 m$\Omega$-cm$^2$ at 1000V.

The Si-IGBT and Si-IGCT data points relate to bipolar devices and demonstrate the advantages of this type of device in the breakdown voltage versus on-resistance compromise. Turning now to SiC another effect comes into play in that, unlike in Si, the resistance of the channel region under the MOSFET Gate becomes significant at "lower" voltages, as shown in FIG. 1.

It has been reported by Cree Inc. that the on-resistance in 4H-SiC devices is roughly half from the Channel region and half from the drift region. This would suggest that the current practical 4H-SiC unipolar limit for MOSFETs is five or six times higher than the theoretical value, probably reflecting the less than perfect material quality.

The SiC JFET data above suggests better performance than the MOSFET. However, this has to be regarded with a degree of caution since by their nature it is difficult to avoid a degree of bipolar action in a JFET. This of course may not be disadvantageous, except that this will bring into play other compromises.

The other bipolar SiC data points for Bipolar Transistors and IGBTs show some improvement over the unipolar limit, but nowhere near the several orders of magnitude difference between Si unipolars and Si bipolars.

Based on FIG. 1 and considering only device performance as governed by drift region consideration (and not costs) then it is clear that at 650V a simple structure MOSFET in SiC should outperform a Superjunction (SJ) Si MOSFET because the higher critical field of SiC permits a very thin drift region to be used. Further, since the SiC device cannot utilise SJ technology then the way is open to produce MOSFETs at higher voltages, as has been demonstrated by Cree Inc. All these unipolar devices conduct using electrons because of their high mobility and hence are termed "n-channel".

However, at some point these unipolar devices will hit the drift region limit, although they are limited by other factors in 4H-SiC currently. Therefore it would be useful if the same "trick" could be employed in SiC to convert MOSFETs into IGBTs by adding a p+ injector. However, in fact this is (almost) impossible in 4H-SiC since all-pervasive nitrogen is an n-type dopant in SiC and the standard method of growing 4H-SiC crystals results in an n+ boule. Some work has been performed to produce p-channel IGBTs in 4H-SiC, forced by the presence of the n+ substrate.

Furthermore, the high channel resistance of 4H-SiC MOSFETs is a well-known problem, the best channel electron mobilities achieved are roughly 5% of the theoretical bulk value. A published review (Advances in SiC power MOSFET technology, Sima Dimitrijev, Philippe Jamet. Microelectronics Reliability 43 (2003) 225-233) summarises the idea that the high density of interface traps close to bottom of the conduction band causes the low mobility in 4H-SiC MOSFETs. The density of these interface traps is assumed to increase sharply toward the edge of the conduction band, where it reaches extremely high values as shown in FIG. 2.

It is an object of the present invention to address the problems discussed above.

SUMMARY

One way to mitigate the SiC unipolar drift region limit is to grow an n– 3C-SiC layer on a p+ Si wafer. This can produce a structure for an n-channel IGBT. It was also reported on the Dimitrijev review that the 3C conduction band is 0.9 eV lower than that of 4H and therefore the acceptor states above should not affect the 3C-SiC (like they can affect 4H-SiC). Therefore low channel resistance in 3C-SiC/Si MOSFETs and IGBTs can be expected.

According to one aspect of the present invention, there is provided a bipolar power semiconductor transistor comprising: a semiconductor substrate of a first conductivity type; a first semiconductor region of the first conductivity type disposed on the semiconductor substrate; a semiconductor drift region of a second conductivity type, opposite the first conductivity type, disposed on the first semiconductor region; a body region of the first conductivity type located within the semiconductor drift region; a source region of the second conductivity type located within the body region; a gate placed above and in contact to the source region, the gate to control charge in a channel region between the semiconductor drift region and the source region and to thereby control flow of charge within the semiconductor drift region; wherein the semiconductor substrate comprises a material comprising silicon (Si) and the first semiconductor region comprises a material comprising 3-step cubic silicon carbide (3C-SiC).

In this way an n-channel IGBT can be produced in 3C-SiC/Si, which is also benefited from the better channel mobility in 3C-SiC compared to 4H-SiC.

The semiconductor substrate may comprise monocrystalline silicon material. The substrate material may be heavily doped using Boron. The first semiconductor region may also be heavily doped and having the same doping concentration level as the substrate region. The semiconductor drift region, the body region and the source region each may comprise a material comprising 3-step cubic silicon carbide (3C-SiC).

When the transistor is in use, the interface between the first semiconductor region and the semiconductor substrate may be conductive due to the presence of a plurality of defects and dislocations in the first semiconductor region. The interface may also be very heavily doped by an injection of Nitrogen in the first SiC growth phase and the up-diffusion of dopant (Boron) from the Si substrate. Hence the potential barriers which normally exist between different semiconductors, the heterojunction, are overcome because the interface between the first semiconductor region and the semiconductor substrate is effectively quasi-metallic.

The gate may be configured to form an n-channel between the source region and the semiconductor drift region through which electron can be injected to the semiconductor drift region. The n-channel may comprise a material comprising 3-step cubic silicon carbide (3C-SiC).

The transistor above may be an insulated gate bipolar transistor (IGBT). The transistor above may be a non-punch through insulated gate bipolar transistor (NPT-IGBT).

The transistor may further comprise a buffer region of the first conductivity type between the first semiconductor region and the semiconductor drift region, the buffer region having lower doping concentration than the first semiconductor region.

The transistor may be a punch-through insulated gate bipolar transistor (PT-IGBT). The buffer region may comprise a material having 3-step cubic silicon carbide (3C-SiC).

The first semiconductor region may be an injection region configured to inject charge into the semiconductor drift region. The drift region may be configured to be depleted of mobile carriers at breakdown voltage during an off-state blocking mode of the transistor and able to conduct charge during an on-state conducting mode of the transistor.

According to a further aspect of the present invention, there is provided a lateral bipolar transistor comprising: a semiconductor substrate of a first conductivity type; a lateral drift region of a second, opposite conductivity type, disposed on the semiconductor substrate; a first semiconductor region of the second conductivity type disposed within the drift region; a contact region of the first conductivity type disposed within the first semiconductor region; a second semiconductor region of the first conductivity type within the drift region, wherein the lateral drift region is placed between the first semiconductor region and the second semiconductor region, the lateral drift region to be depleted of mobile carriers at breakdown voltage during an off-state blocking mode of the transistor and able to conduct charge during an on-state conducting mode of the transistor; a source region of the second conductivity type located within the second semiconductor region; a gate placed above and in contact to the second semiconductor region, the gate to control charge in a channel region between the lateral drift region and the source region and to thereby control flow of charge within the lateral drift region; wherein the semiconductor substrate comprises a material comprising silicon and the lateral drift region comprises a material comprising 3-step cubic silicon carbide (3C-SiC).

The first contact region, the first and second semiconductor regions and the lateral drift region each may comprise a material comprising 3-step cubic silicon carbide (3C-SiC).

A lateral insulated gate bipolar transistor (LIGBT) may incorporate the transistor as described hereinbefore.

According to a further aspect of the present invention, there is provided a semiconductor transistor comprising: a semiconductor substrate having a first conductivity type; a first semiconductor region having the first conductivity type disposed on the semiconductor substrate; a drift region having a second, opposite conductivity type, disposed on the first semiconductor region, the drift region having lower doping concentration compared to the first semiconductor region; a second semiconductor region of the first conductivity type disposed on the drift region, the second semiconductor region having higher doping concentration than the drift region; and a contact region of the second conductivity type located within the second semiconductor region, the contact region having higher doping concentration than the second semiconductor region; wherein the semiconductor substrate comprises a material comprising silicon and wherein the first semiconductor region comprises a material comprising 3-step cubic silicon carbide (3C-SiC).

The substrate may comprise monocrystalline silicon material. The drift region, the second semiconductor region and the contact region each may comprise a material comprising 3-step cubic silicon carbide.

A thyristor may incorporate the transistor as described hereinbefore.

According to a further aspect of the present invention, there is provided a method of manufacturing a bipolar power semiconductor transistor, the method comprising: forming a semiconductor substrate of a first conductivity type using silicon material forming a first semiconductor region of the first conductivity type using 3-step cubic silicon carbide (3C-SiC) material; forming a semiconductor drift region of a second conductivity type, opposite the first conductivity type; forming a body region of the first conductivity type located within the body region; forming a source region of the second conductivity type within the body region; forming a gate above and in contact to the source region, the gate to control charge in a channel region between the semiconductor drift region and the source region and to thereby control flow to charge, within the semiconductor drift region.

The semiconductor substrate may comprise a material comprising monocrystalline silicon and the semiconductor drift region, the body region and the source region each comprise a material comprising 3-step cubic silicon carbide (3C-SiC).

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION OF THE PREFERRED EMBODIMENTS

Figure 1:
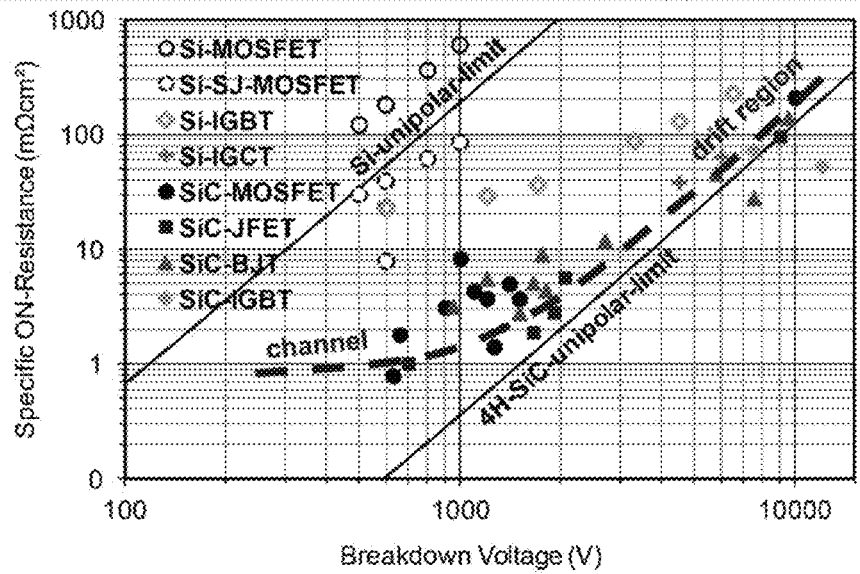
FIG. 1 illustrates a graph showing trade-off between breakdown voltage and specific on-resistance for the state of the art semiconductor devices.
Figure 2:
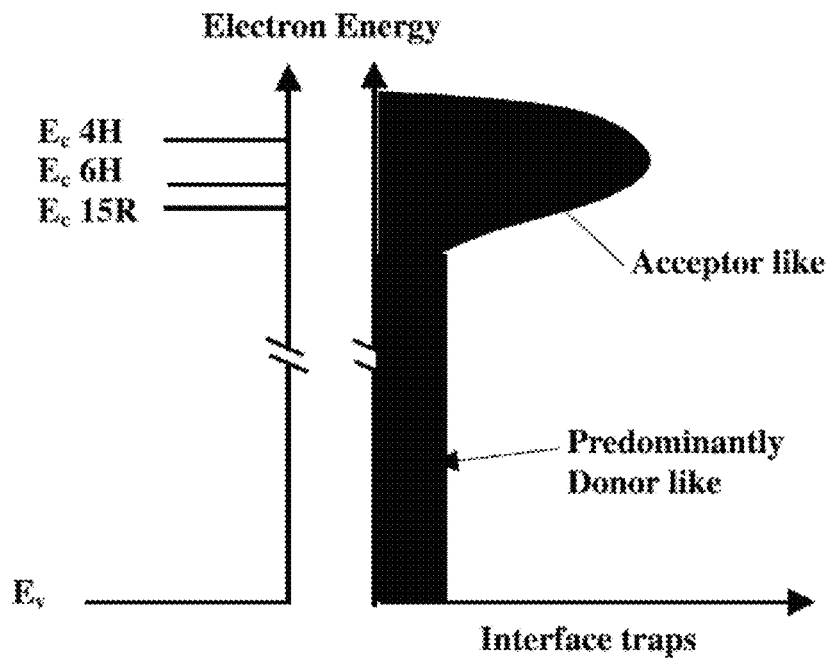
FIG. 2 illustrates an energy band diagram showing the likely position of interface states for 4H-, 6H- and 15R-SiC.
Figure 3:
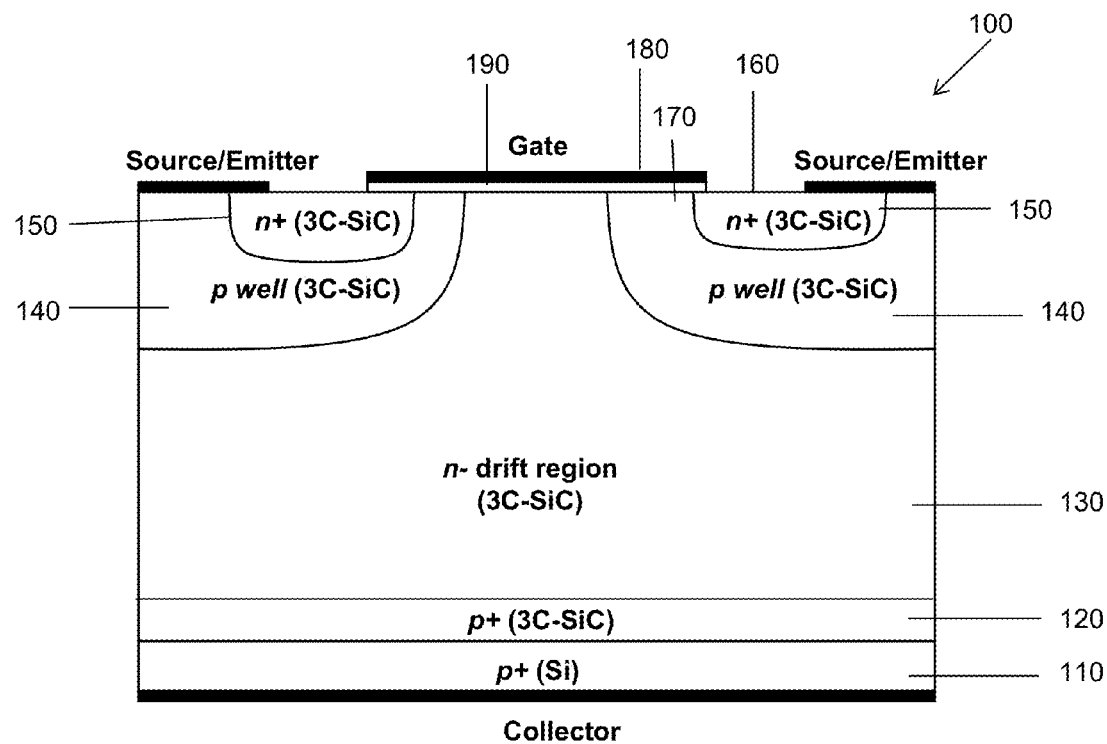
FIG. 3 illustrates a schematic cross section of an IGBT.

Referring to FIG. 3, an example of a vertical power semiconductor transistor 100 in the form of an insulated gate bipolar transistor (IGBT) is shown. The transistor 100 has first and second 3-step cubic silicon carbide (3C-SiC) epitaxial layers 120, 130 grown using the process described in WO2013061047 from which the present application claims the continuation in part relationship. The silicon carbide epitaxial layers 120, 130 include a heavily-doped p-type layer 120 which is supported on a p– type silicon substrate 110, and a lightly-doped n-type layer 130 which provides a drift region and which is supported on the p-type silicon carbide layer 120. The first epitaxial layer 120 provides a p-type collector. P-type wells 140 at the surface 160 of the epitaxial layer 130 provide body regions 140. N-type wells 150 within the p-type wells 140 provide contact regions and provide emitters. The body region 140 and the contact region 150 can be formed using 3C-SiC material. A channel 170 is formed beneath a gate 180 which is separated using a gate dielectric layer 190.

The IGBT shown in FIG. 3 is able to support much greater breakdown voltages due to the use of 3C-SiC in the epitaxial drift region 130. At the same time the on-resistance of the 3C-SiC IGBT can be significantly lower than the 4H-SiC IGBT. This is because a better channel mobility is observed in 3C-SiC (compared to 4H-SiC) and therefore the on-resistance of the channel region formed between the drift region 130 and the emitter region 150 can be significantly reduced.

It will be appreciated that a heterostructure is formed between the p+ silicon substrate 110 and p+ 3C-SiC layer 120. The 3C-SiC material in the first epitaxial layer 130 (~2 microns) just above the SiC/Si interface 200 is very heavily defective because of the lattice miss-match between the two materials and heavily doped with Al as-grown, consequently this defective region is very conductive. In this way the heterojunction structure and consequent potential barriers can be overcome by becoming a quasi-metallic interface due to the presence of the dislocations, Al doping during epitaxial growth and Boron up-diffusion from the Si substrate.

The on-state and off-state operations of the IGBT 100 are described below.

The IGBT as shown in FIG. 3 has within its structure two MOS-bipolar devices:
(i) A cascade MOSFET-PIN diode;
(ii) A MOS base current controlled-wide base PNP transistor.

Figure 4:
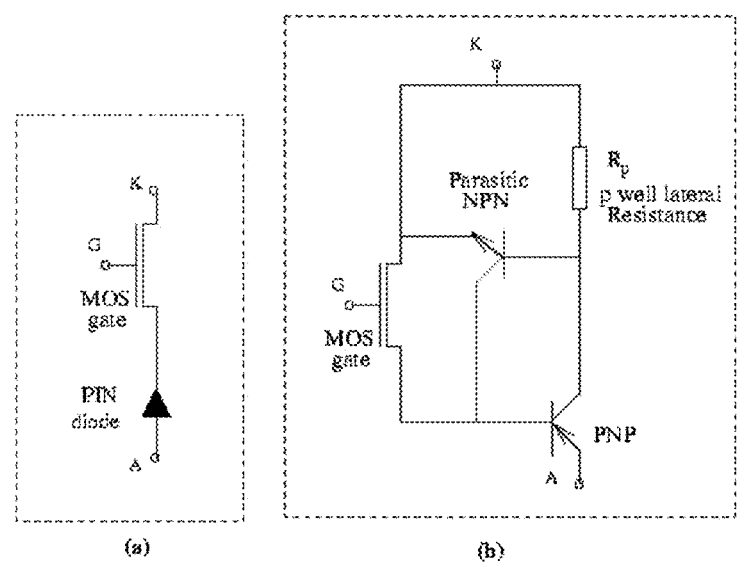
FIG. 4 illustrates an equivalent circuit diagram of the IGBT of FIG. 3.

The equivalent circuits for these components of the IGBT structure 100 are shown in FIG. 4.

In the off-state a reverse biased PIN diode (formed by region 120, drift region 130 and body region 140) serves to support the high voltage applied between the emitter 150 and collector 120.

The transistor 100 can be turned-on by applying a positive voltage to the gate 180 with respect to the emitter 150 to invert the p base surface under the insulated gate 180. The channel 170 is then formed at the surface of the body region 140, between the n+ emitter 150 and the n– drift region 130, which allows electrons to be injected into the n-drift region 130. This electron current serves as a base current for the bipolar PNP transistor formed between the p+ emitter 150, the n– drift region (base) 130 and the p+ 3C-SiC collector 120. Once the PNP transistor (within the IGBT 100) is turned on, excess carrier charge (plasma) builds up in the lowly-doped n– drift region 130 and the conductivity of this layer increases significantly.

The transistor 100 can be turned-off by short-circuiting the gate voltage to the emitter 150 which cuts off the supply of electrons to the base (the drift region 130) of the PNP transistor within the IGBT 100 as described above. The turn-off speed of the device 100 is determined by the open base current decay of the PNP transistor within the IGBT 100 which in turn is dependent on the excess carrier charge (plasma) stored in the n– drift region 130.

The IGBT 100 of FIG. 3 is a non-punch through (NPT) IGBT in which the n-drift region 130 has a longer length such that, during the off-state, the depletion region in the drift region 130 does not reach the p+ SiC layer 120.

Figure 5:
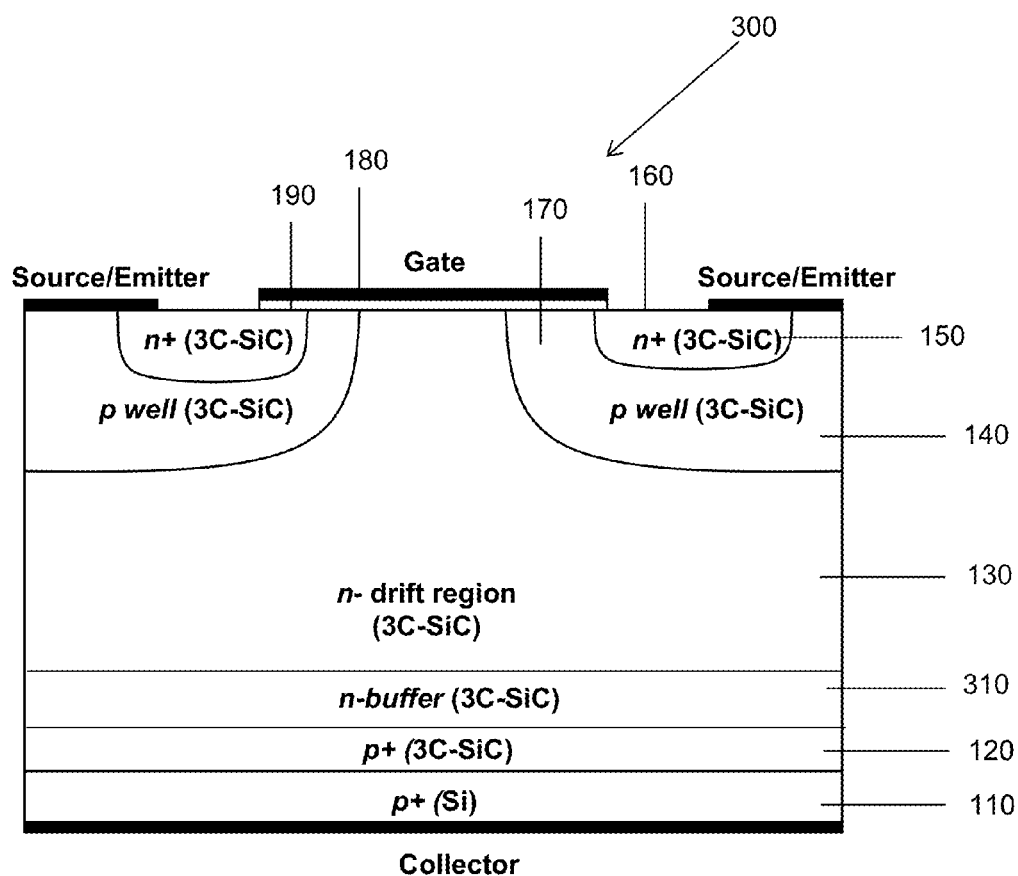
FIG. 5 illustrates a schematic cross section of an alternative IGBT.

FIG. 5 illustrates a schematic cross-section of a punch-through (PT) IGBT 300. Many features of the IGBT in FIG. 5 are the same as those shown in FIG. 3 and therefore carry the same reference numerals. However, the IGBT structure 300 in FIG. 5 has an additional layer which is a buffer layer 310 between the p+ SiC layer 120 and the n-drift region 130. The buffer layer 310 is an n type layer having higher doping concentration than the n-drift region 130. The n buffer layer 310 and the n– drift layer 130 are made one after the other by epitaxial growth. The n buffer 310 can have a double role: it stops the depletion region to reach the collector 120 and it adjust the injection efficiency of the collector junction. This helps to control the plasma growth during on-state and thus control the trade-off between the on-state losses and turn-off speed and losses.

Figure 6:
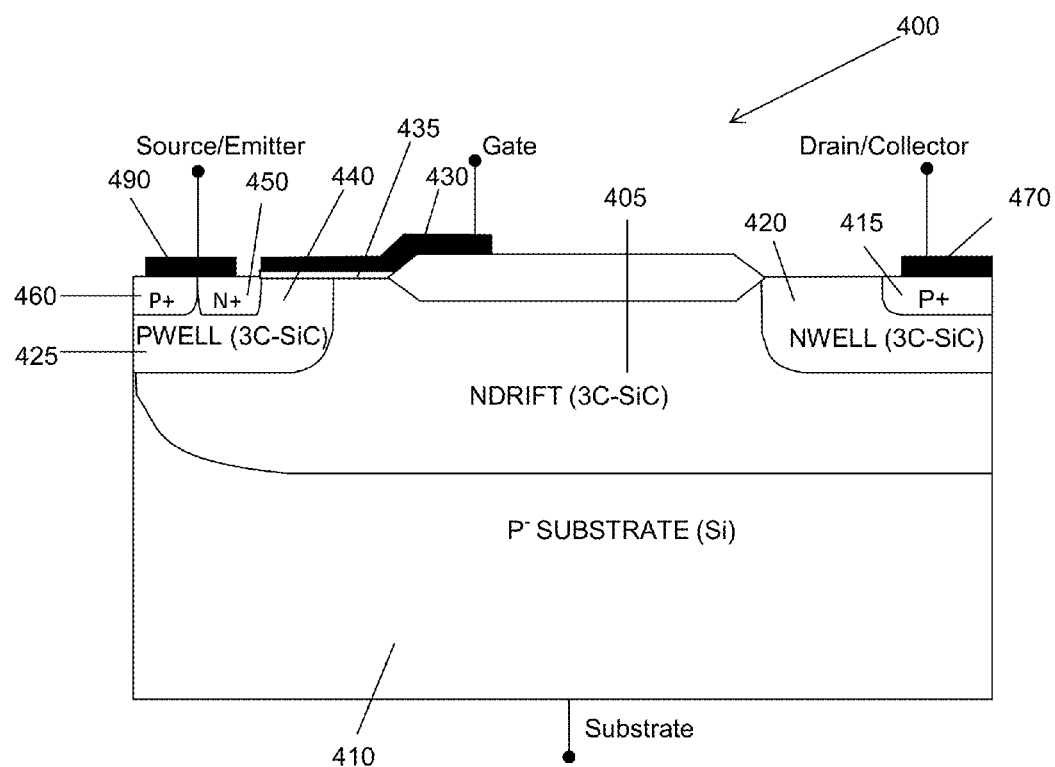
FIG. 6 illustrates a schematic cross section of a lateral IGBT.

Referring to FIG. 6, an example of a lateral power semiconductor transistor 400 in the form of an lateral insulated gate bipolar transistor (LIGBT) is shown. FIG. 6 shows schematically a cross-sectional view of an LIGBT 400. In this figure, an n-type drift region 405 is formed on a p-type substrate 410. The substrate 410 is a monocrystalline silicon substrate and the drift region 405 is a 3-step cubic silicon carbide (3C-SiC) epitaxial layer. The 3C-SiC drift region 405 on the silicon substrate 410 is formed using the process described in WO2013061047 from which the present application claims the continuation in part relationship. The drift region 410 is generally depleted of mobile carriers during the off-state blocking mode to support the breakdown voltage and conduct charge during the on-state conducting mode. A p-type region 415 forms an ohmic contact with a drain electrode 470. An n-type region 420 surrounds the p-type region 415 and is more highly doped than the drift region 405. The n-type region 420 prevents the punch through breakdown and can also be used to alter LIGBT characteristics. A p-well 425 forms a device channel region 440. A gate electrode 430 is placed on top of this region and is separated by a thin oxide 435. The gate electrode 430 is used to control the charge in the channel region 440 by controlling the flow of charge within the drift region 405. A further n-type region 450 and p-type region 460 are formed within the p-well 425 which are connected together forming the ohmic contact to a device source electrode 490. The p-type region 415, n-type region 420, the p-well 425, the further n-type region 450 and the further p-type region 460 are made of 3C-SiC material. In this IGBT structure, the current flows from the source electrode 490 to the drain electrode 470 in a lateral direction (unlike the IGBT structure of FIG. 3 in which the current flow in a vertical direction). In this embodiment, the on-resistance in the channel region is also significantly reduced due to the increased mobility of the 3C-SiC.

Figure 7:
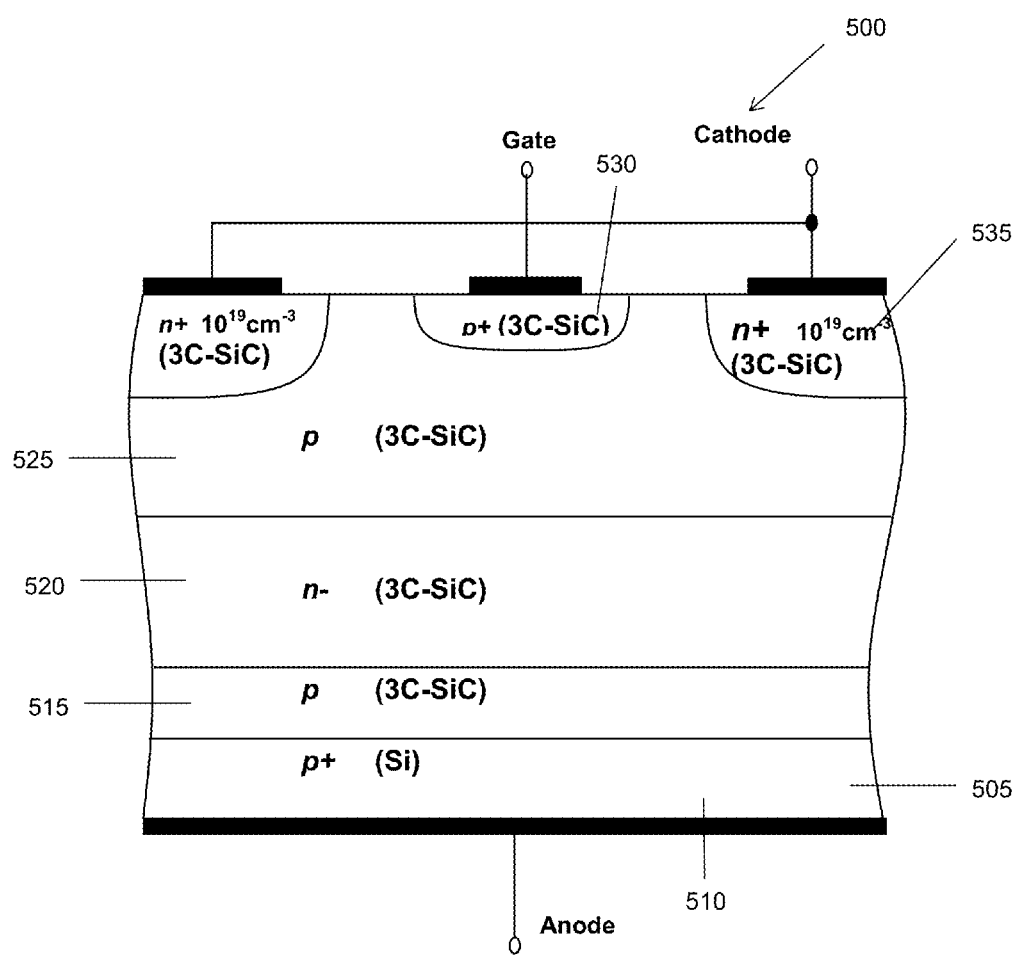
FIG. 7 illustrates a schematic cross section of a thyristor.

FIG. 7 illustrates a schematic view of a thyristor 500 according to one embodiment of the present invention. The thyristor 500 is a four layer power bipolar semiconductor device having four alternating layers of p-type and n-type doping. The thyristor 500 is a current-control device and in the on-state operates under very high level carrier injection. The thyristor 500 has a p+ layer 505 to which an anode ohmic contact 510 is formed. The p+ layer 505 therefore forms an anode region 505. The anode region 505 includes monocrystalline silicon as a material. A p-type layer 515 is formed on the anode region 505. The p-type layer 515 has lower doping concentration than that of the anode region 505. The p-type layer 515 includes 3-step cubic silicon carbide (3C-SiC) as a material. A n-drift region 520 is formed on the p-type layer 515. A second p-type region 525 is formed on the drift region 520. The second p-type region 525 has higher doping concentration than that of the drift region 520. A further p+ region 530 is disposed within the second p-type region 525. A gate 530 is directly disposed on the further p+ region 530. An p+ type region providing a cathode region 535 is formed within the second p-type region 525. The cathode region 535 is heavily doped and therefore a cathode ohmic contact is formed directly on the cathode region 535. The drift region 520, the second p-type region 525, the further p-type region 530 and the cathode region 535 each include a material comprising 3C-SiC.

The thyristor 500 can be turned on by the gate 530 by applying a positive current pulse. To turn-off the thyristor 500, a reverse bias voltage is applied across the anode-cathode terminal. In the forward blocking state the anode region 505 is biased positive with respect to the cathode region 535, while in the reverse blocking state the anode region 505 is biased negative with respect to the cathode region 535.

Although the embodiment of FIG. 7 is directed to a normal thyristor structure in which 3C-SiC layers are formed on a silicon wafer 505, it will be appreciated that the same principal can be applied to other thyristor structures, for example, a gate turn-off (GTO) thyristor and a gate-commutated thyristor (GCT).

Similarly the principal of forming 3C-SiC epitaxial layers on silicon wafer can be equally applied to other semiconductor devices such as a vertical bipolar junction transistor (BJT). The structure of the vertical bipolar junction transistor is similar to the thyristor shown in FIG. 7, except that p+ anode layer 505 and the p layer 515 on top of the p+ anode layer 505 are replaced by an p+ layer having silicon material.

Furthermore, the same concept can be equally applied to a lateral bipolar junction transistor, a substrate fed logic device and an integrated injection logic device.

It will be appreciated that the doping concentrations of various layers of the transistors discussed with reference to FIGS. 3 to 7 are those used in the corresponding state of the art transistors.

The skilled person will understand that in the preceding description and appended claims, positional terms such as 'above', 'overlap', 'under', 'lateral', 'vertical', etc. are made with reference to conceptual illustrations of a transistor, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

It will be noted that the term "first conductivity type" can refer to a p-type doping polarity and the term "second conductivity" can refer to a n-type doping polarity. However, these terms are not restrictive. It will be appreciated that all doping polarities mentioned above could be reversed, the resulting devices still being in accordance with the present invention. It will be appreciated that the emitter, collector and gate could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A bipolar power semiconductor transistor comprising:
   a semiconductor substrate of a first conductivity type;
   a first semiconductor region of the first conductivity type disposed on the semiconductor substrate;
   a semiconductor drift region of a second conductivity type, opposite the first conductivity type, disposed on the first semiconductor region;
   a body region of the first conductivity type located within the semiconductor drift region;
   a source region of the second conductivity type located within the body region;
   a gate placed above and in contact to the source region, the gate to control charge in a channel region between the semiconductor drift region and the source region and to thereby control flow of charge within the semiconductor drift region;
   wherein the semiconductor substrate comprises a material comprising silicon (Si) and the first semiconductor region comprises a material comprising 3-step cubic silicon carbide (3C-SiC).

2. A transistor according to claim 1, wherein the semiconductor substrate comprises moncrystalline silicon material.

3. A transistor according to claim 1, wherein the semiconductor drift region, the body region and the source region each comprise a material comprising 3-step cubic silicon carbide (3C-SiC).

4. A transistor according to claim 1, wherein, in use, the interface between the first semiconductor region and the semiconductor substrate is conductive due to the presence of a plurality of dopants, defects and dislocations in the first semiconductor region.

5. A transistor according to claim 4, wherein the interface between the first semiconductor region and the semiconductor substrate is a quasi-metallic interface which overcomes the potential barrier at the interface due to the presence of the dopants, defects and dislocations.

6. A transistor according to claim 1, wherein the gate is configured to form an n-channel between the source region and the semiconductor drift region through which electron can be injected to the semiconductor drift region.

7. A transistor according to claim 6, wherein the n-channel comprises a material comprising 3-step cubic silicon carbide (3C-SiC).

8. A transistor according to claim 1 being an insulated gate bipolar transistor (IGBT).

9. A transistor according to claim 1 being a non-punch through insulated gate bipolar transistor (NPT-IGBT).

10. A transistor according to claim 1, further comprising a buffer region of the first conductivity type between the first semiconductor region and the semiconductor drift region, the buffer region having lower doping concentration than the first semiconductor region.

11. A transistor according to claim 10 being a punch-through insulated gate bipolar transistor (PT-IGBT).

12. A transistor according to claim 10, wherein the buffer region comprises a material having 3-step cubic silicon carbide (3C-SiC).

13. A transistor according to claim 1, wherein the first semiconductor region is an injection region configured to inject charge into the semiconductor drift region.

14. A transistor according to claim 1, wherein the drift region is configured to be depleted of mobile carriers at breakdown voltage during an off-state blocking mode of the transistor and able to conduct charge during an on-state conducting mode of the transistor.

15. A lateral bipolar transistor comprising:
a semiconductor substrate of a first conductivity type;
a lateral drift region of a second, opposite conductivity type, disposed on the semiconductor substrate;
a first semiconductor region of the second conductivity type disposed within the drift region;
a contact region of the first conductivity type disposed within the first semiconductor region;
a second semiconductor region of the first conductivity type within the drift region, wherein the lateral drift region is placed between the first semiconductor region and the second semiconductor region, the lateral drift region to be depleted of mobile carriers at breakdown voltage during an off-state blocking mode of the transistor and able to conduct charge during an on-state conducting mode of the transistor;
a source region of the second conductivity type located within the second semiconductor region;
a gate placed above and in contact to the second semiconductor region, the gate to control charge in a channel region between the lateral drift region and the source region and to thereby control flow of charge within the lateral drift region;
wherein the semiconductor substrate comprises a material comprising silicon and the lateral drift region comprises a material comprising 3-step cubic silicon carbide (3C-SiC).

16. A transistor according to claim 15, wherein the first contact region, the first and second semiconductor regions and the lateral drift region each comprise a material comprising 3-step cubic silicon carbide (3C-SiC).

17. A lateral insulated gate bipolar transistor (LIGBT) incorporating the transistor of claim 15.

18. A semiconductor transistor comprising:
a semiconductor substrate having a first conductivity type;
a first semiconductor region having the first conductivity type disposed on the semiconductor substrate;
a drift region having a second, opposite conductivity type, disposed on the first semiconductor region, the drift region having lower doping concentration compared to the first semiconductor region;
a second semiconductor region of the first conductivity type disposed on the drift region, the second semiconductor region having higher doping concentration than the drift region; and
a contact region of the second conductivity type located within the second semiconductor region, the contact region having higher doping concentration than the second semiconductor region;
wherein the semiconductor substrate comprises a material comprising silicon and wherein the first semiconductor region comprises a material comprising 3-step cubic silicon carbide (3C-SiC).

19. A transistor according to claim 18, wherein the substrate comprises moncrystalline silicon material and wherein the drift region, the second semiconductor region and the contact region each comprise a material comprising 3-step cubic silicon carbide.

20. A thysistor incorporating the transistor of claim 18.

21. A method of manufacturing a bipolar power semiconductor transistor, the method comprising:
forming a semiconductor substrate of a first conductivity type using silicon material;
forming a first semiconductor region of the first conductivity type using 3-step cubic silicon carbide (3C-SiC) material, the first semiconductor region being disposed on the semiconductor substrate;
forming a semiconductor drift region of a second conductivity type, opposite the first conductivity type, the semiconductor drift region being disposed on the first semiconductor region;
forming a body region of the first conductivity type located within the semiconductor drift region;
forming a source region of the second conductivity type within the body region;
forming a gate above and in contact to the source region, the gate to control charge in a channel region between the semiconductor drift region and the source region and to thereby control flow to charge, within the semiconductor drift region.

22. A method according to claim 21, wherein the semiconductor substrate comprises a material comprising monocrystalline silicon and the semiconductor drift region, the body region and the source region each comprise a material comprising 3-step cubic silicon carbide (3C-SiC).

* * * * *